United States Patent [19]

Kubo et al.

[11] Patent Number: 4,826,297
[45] Date of Patent: May 2, 1989

[54] LIQUID CRYSTAL DISPLAY DEVICE HAVING AN EXTENTION METAL FILM WIRING WHICH IS COVERED BY POLYIMIDE LAYER HAVING LOW VISCOSITY UNDER 1.0 POISE BEFORE CURING

[75] Inventors: Kiichirou Kubo; Mikio Kanazaki; Shinobu Toma, all of Mobara, Japan

[73] Assignees: Hitachi, Ltd.; Hitachi Device Eng., Co., both of Tokyo, Japan

[21] Appl. No.: 943,747

[22] Filed: Dec. 19, 1986

[30] Foreign Application Priority Data

Dec. 25, 1985 [JP] Japan .................................. 60-290558

[51] Int. Cl.$^4$ ........................... G02F 1/13; H01L 39/02
[52] U.S. Cl. ............................. 350/339 R; 350/331 R; 350/334; 357/80
[58] Field of Search ............... 350/334, 331 R, 339 R; 339/17 M, 17 L; 368/342, 242, 80, 30; 357/80, 84

[56] References Cited

U.S. PATENT DOCUMENTS

| | | | |
|---|---|---|---|
| 4,145,120 | 3/1979 | Kubota | 357/80 |
| 4,336,551 | 6/1982 | Fujita et al. | 357/80 |
| 4,640,583 | 2/1987 | Hoshikawa et al. | 350/343 |
| 4,643,526 | 2/1987 | Watanabe et al. | 350/339 R |
| 4,653,859 | 3/1987 | Masaki | 350/333 |
| 4,696,994 | 9/1987 | Nakajima et al. | 528/125 |

FOREIGN PATENT DOCUMENTS

| | | | |
|---|---|---|---|
| 0073693 | 6/1977 | Japan | 350/336 |
| 0094650 | 7/1981 | Japan | 357/84 |
| 0126945 | 10/1981 | Japan | 357/84 |
| 0077250 | 5/1983 | Japan | 357/84 |
| 79555 | 5/1984 | Japan . | |
| 231431 | 12/1984 | Japan . | |
| 0220317 | 11/1985 | Japan | 350/334 |
| 2142460 | 1/1985 | United Kingdom . | |
| 2160693 | 12/1985 | United Kingdom . | |

Primary Examiner—Stanley D. Miller
Assistant Examiner—Huy K. Mai
Attorney, Agent, or Firm—Antonelli, Terry & Wands

[57] ABSTRACT

A liquid crystal display device comprising upper and lower substrates with electrodes on the inner surfaces thereof, at least one of said upper and lower substrates including an extended portion thereof which projects beyond the edge of the other substrate, liquid crystal material sandwiched between said upper and lower substrates, a sealing member disposed around the periphery enclosing said liquid crystal material, a driving integrated circuit chip mounted on the inner surface of said extended portion, metal film wiring formed on the inner surface of said extended portion mechanically and electrically connected to said driving integrated circuit chip via solder, polyimide resin coating covering said metal film wirings, and resin coating covering said polyimide resin for filling up pinholes in the polyimide resin coating and being of low viscosity before curing.

7 Claims, 2 Drawing Sheets

LIQUID CRYSTAL DISPLAY DEVICE HAVING AN EXTENTION METAL FILM WIRING WHICH IS COVERED BY POLYIMIDE LAYER HAVING LOW VISCOSITY UNDER 1.0 POISE BEFORE CURING

BACKGROUND OF THE INVENTION

The present invention relates to a liquid crystal display device and, more particularly, to a liquid crystal display device having a liquid crystal cell and an integrated circuit semiconductor chip for driving the cell mounted on one of a pair of substrates forming the cell.

In the conventional type liquid crystal display device with a driving integrated circuit chip mounted on one of substrates forming a liquid crystal display cell, the liquid crystal display device has the construction in which metal films are formed and patterned for electrical wiring on one of the substrates constituting the cell and a driving integrated circuit semiconductor chip which shall be hereinafter referred to as an LSI chip is bonded directly on patterned metal film as shown in FIG. 1. The liquid crystal display cell 1 comprises a lower substrate 2 and an upper substrate 4 both of which are made of transparent glass or other like material, with transparent electroconductive electrodes 9 and 10, respectively formed on the inner surfaces thereof, and arranged substantially parallel to each other with a predetermined spacing, for example, 5 to 15 $\mu$m, and sealed at the periphery with a sealing member 3 such as frit glass or an organic adhesive, and a nematic liquid crystal 11 sandwiched therebetween. Multilayer metal film wiring 12 including a metal film layer having good wettability with solder is formed on the lower substrate 2 and an LSI chip 6 is mechanically and electrically bonded on the multilayer metal film wiring 12 via solder 5, and the LSI chip 6 and multilayer metal film wiring 12 are covered with epoxy resin 7 and resin 8 for filling up pinholes in the epoxy resin 7 to be protected from external environments as proposed in co-pending Japanese Application No. SHO 59-76480.

Under highly humid environmental conditions, the above-mentioned type liquid crystal display device sometimes resulted in failures to display because disconnections of metal film wiring due to corrosion or electrochemical reaction, or short-circuits between the metal film wirings due to separated metals on operating condition, resulting from forming of a water film between adjacent metal film wirings caused by water absorption of resin coatings 7 and 8 and from peeling-off of resin coatings 7 and 8 from the substrate 2. As a solution to the above problem it is proposed to cover the metal film wiring 12 with inorganic material film in the above-mentioned Japanese Patent Application No. SHO 59-76480. This has ensured reliability under sever environmental conditions, but it increases the time and cost of production when a sputtering technique is adopted.

SUMMARY OF THE INVENTION

Accordingly an object of the present invention is to provide a liquid crystal display device having high reliability under sever environmental conditions and having the cost of production reduced.

Another object of the present invention is to provide a compact and highly reliable liquid crystal display device with driving integrated circuits mounted on its substrate.

The above mentioned objects can be accomplished by the present invention which provides a liquid crystal display device comprising: upper and lower substrates with electrodes on the inner surfaces thereof, at least one of said upper and lower substrates including an extended portion thereof which projects beyond the edge of the other of said substrate, liquid crystal material sandwiched between said upper and lower substrates, a sealing member disposed around the periphery enclosing said liquid crystal material, a driving integrated circuit chip mounted on the inner surface of said extended portion, metal film wirings formed on the inner surface of said extended portion and mechanically and electrically connected to said driving integrated circuit chip via solder, polyimide resin coating covering said metal film wiring and resin coating covering said polyimide resin for filling up pinholes in the polyimide resin and being of low viscosity before curing. Polyimide resin can be applied on the metal film wirings with roll coating techniques, and therefore its process is simple and completed in a short time. Since polyimide resin has superior resistance to deterioration by heat, subsequent heat treatments for fabrication of liquid crystal aligning film on substrates and for sealing the two substrates to form a liquid crystal cell do not degrade said polyimide protective coating. Further, another resin of low viscosity before curing is applied over said polyimide resin coating to fill up pinholes of the polyimide resin coating, therefore reliability of said metal film wirings against severe environmental conditions can be enhanced greatly.

DETAILED DESCRIPTION OF THE PREFERRED EMBODIMENTS

The preferred embodiments of the present invention will be described with reference to the accompanying drawings.

Figure 1:
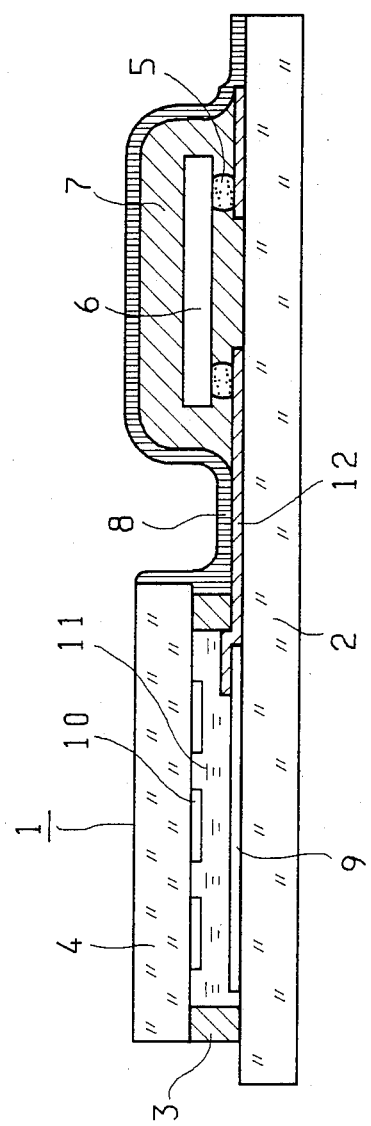
FIG. 1 is a cross sectional view of a prior art type liquid crystal display.
Figure 2:
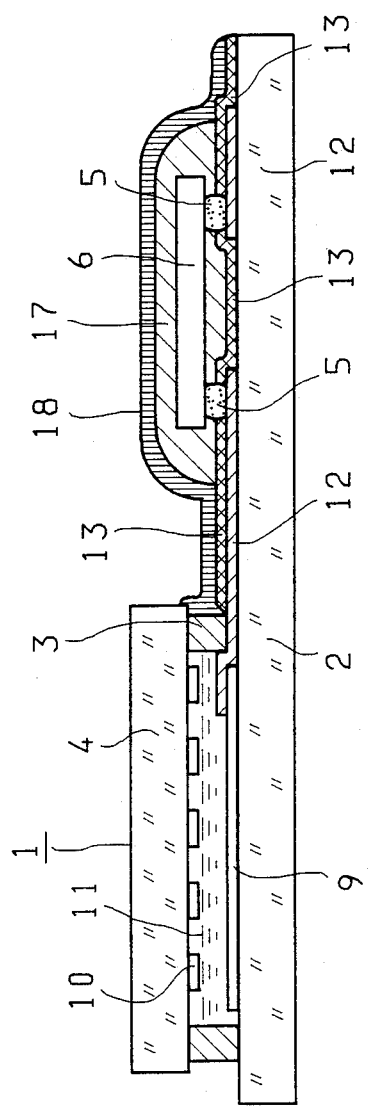
FIG. 2 is a cross sectional view of one embodiment of the liquid crystal display device of the present invention.

FIG. 2 shows a cross sectional view of one embodiment of the liquid crystal display device of the present invention, same reference numerals being applied to same or corresponding elements.

First, on the internal opposed sides of said both lower and upper substrates 2 and 4 are provided the transparent electrodes 9 and 10, respectively, of a predetermined display pattern and made of indium oxide or the like. Next, on the surface of the lower substrate 2, NiCr film with good adhesion with the glass substrate, Cu film with good wetting with solder, and Cr film for preventing oxidization of said Cu film and for preventing wetting of solder with Cu are laminated by evaporating in the order named to form a multilayer metal film, and said multilayer metal film is etched into a wiring pattern to form metal film wirings 12 which connect transparent electrodes 9 with locations on the lower substrate 2 where an LSI chip 6 is to be mounted in a subsequent step. Next, highly heat-resisting polyimide resin with the temperature of thermal decomposition above 300° C., for example, photosensitive heat-resisting polyimide resin with the said temperature of 450° C. which is convenient for etching said patterns, in this embodiment (for example, PL-1000 available from Hitachi Chemical Co., Ltd. or UR3100 available from Toray Industries, Inc., Japan) is applied on the lower substrate 2 and through holes are etched therein in order to mechanically and electrically connect the LSI chip 6 with the multilayer metal film wirings 12 via solder 5, resulting in wiring-protective polyimide coating 13. On the electrode side of the lower and upper substrates 2, 4, polyimide resin is applied and heated at 200° C. to 350° C. in order to form liquid crystal aligning film (not shown) as described in Japanese Patent Publication No. SHO 58-55488.

A liquid crystal display cell 1 is fabricated by applying epoxy resin as a sealing member 3 substantially entirely around the periphery of the upper substrate 4 with an opening (not shown) therein for injecting liquid crystal material 11 into the cell 1, sealing the substrates 2 and 4 with a predetermined spacing of 5 to 10$\mu$ between electrodes 9 and 10 by curing said epoxy resin at 180° C. A liquid crystal material 11 is injected via said opening into the liquid crystal cell 1 and the opening is sealed with an adhesive. Through holes are etched at the locations in the top layer, Cr film, of the multilayer metal film 12, corresponding to locations of solder 5 for bonding the LSI chip 6 and the LSI chip 6 is bonded on the predetermined location via solder 5 electrically connecting the LSI chip 6 with the multilayer metal film wirings 12. Chip-protective resin 17 made of epoxy resin is applied entirely over the LSI chip 6 to protect the chip 6 against environmental conditions. Then in order to fill up possible pinholes in the polyimide resin coating 13, resin of low viscosity below 1.0 poise (for example 0.5 poise) before curing, for example, urethane resin (for example, TF-1154 available from Hitachi Chemical Co., Ltd.) is applied and forms a protective resin coating 18.

In this embodiment the wiring-protective coating 13 is made of highly heat-resisting resin, and therefore in the subsequent process after application of wiring-protective coating 13, heat treatments for fabrication of the liquid crystal aligning film and for curing of the sealing member 3 do not deteriorate the wiring-protective coating 13.

In the reliability tests, the liquid crystal display devices of this embodiment were operated with 9 volts applied across the liquid crystal layer for 1000 hours under the environmental conditions of 80° C. and 90% relative humidity and no corrosion such as electrolysis in metal film wirings 12, and no failures such as peeling-off of metal film wirings occurred after 500 cycles of temperature cycling test between $-40°$ C. and 80° C.

In another embodiment, multilayer metal film wirings made of Ni-Au instead of the above-mentioned metal film wiring produced the same results as the above embodiment.

According to the present invention it is possible to enhance stability and reliability of the liquid crystal display device under sever environmental conditions, to the degree comparable with those with protective coating made of $SiO_2$, and to reduce the manufacturing cost by simplifying fabrication process compared with $SiO_2$ protective coating.

What is claimed is:
1. A liquid crystal display device comprising:
upper and lower substrates with electrodes on the inner surfaces thereof, at least one of said upper and lower substrates including an extended portion thereof which projects beyond the edge of the other substrate,
liquid crystal material sandwiched between said upper and lower substrates,
a sealing member disposed around the periphery enclosing said liquid crystal material,
a driving integrated circuit chip mounted on the inner surface of said extended portion,
metal film wiring formed on the inner surface of said extended portion mechanically and electrically connected to said driving integrated circuit chip via solder,
a first resin coating comprising polyimide and covering said metal film wirings,
and a second resin coating covering said first resin coating for filling up pinholes in the first resin coating and being of low viscosity under 1.0 poise before curing.
2. A liquid crystal display device according to claim 1, wherein said second resin coating covering said first resin coating is made of urethane resin.
3. A liquid crystal display device according to claim 1 wherein said first resin coating covering said metal film wirings has a temperature of thermal decomposition above 300° C.
4. A liquid crystal display device according to claim 1 wherein said first resin coating is made of photosensitive polyimide resin.
5. A liquid crystal display device according to claim 1, wherein said first resin coating also covers a part of the inner surface of said extended portion that underlies said driving integrated circuit chip and that is between parts of said metal film wiring.
6. A liquid crystal display device according to claim 1, wherein said driving integrated circuit chip is covered with a third resin coating; said third resin also covering portions of said first resin coating adjacent to said driving integrated circuit chip and being covered by a portion of said second resin coating.
7. A liquid crystal display device according to claim 6, wherein said third resin coating is an epoxy resin.

* * * * *